United States Patent
Barringer et al.

(10) Patent No.: US 6,816,383 B2
(45) Date of Patent: Nov. 9, 2004

(54) CASSETTE HOUSING FOR PRINTED CIRCUIT CARDS

(75) Inventors: Dennis R. Barringer, Wallkill, NY (US); David Lund, Byron, MN (US); Christopher M. Marroquin, Rochester, MN (US); Budy D. Notohardjono, Poughkeepsie, NY (US); Gregory H. Richardson, Sumner, WA (US); Scott A. Shurson, Mantorville, MN (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 10/194,154

(22) Filed: Jul. 12, 2002

(65) Prior Publication Data

US 2004/0008497 A1 Jan. 15, 2004

(51) Int. Cl.$^7$ .............................. H06K 7/10; H05K 9/00; H01R 13/46
(52) U.S. Cl. ...................... 361/759; 361/740; 361/741; 361/747; 361/732; 361/801; 361/818; 361/816; 174/35 R; 174/35 GC; 439/377; 439/65
(58) Field of Search .................................. 361/725, 726, 361/728, 730, 732, 736, 740, 741, 747, 752, 754–756, 759, 801; 174/35 R, 35 GC; 439/377, 65

(56) References Cited

U.S. PATENT DOCUMENTS

| | | | |
|---|---|---|---|
| 6,062,894 A | 5/2000 | Barringer | 439/377 |
| 6,166,913 A | 12/2000 | Fun et al. | 361/737 |
| 6,191,950 B1 | 2/2001 | Cox et al. | 361/737 |
| 6,219,252 B1 | 4/2001 | Tsai | 361/752 |
| 6,313,400 B1 | 11/2001 | Mosquera et al. | 174/35 R |
| 6,406,322 B1 * | 6/2002 | Barringer et al. | 439/377 |
| 6,493,235 B1 * | 12/2002 | Barringer et al. | 361/756 |
| 6,529,383 B1 * | 3/2003 | Barringer et al. | 361/754 |
| 6,597,581 B2 * | 7/2003 | Barringer et al. | 361/756 |
| 6,606,255 B2 * | 8/2003 | Barringer et al. | 361/807 |
| 6,660,932 B1 * | 12/2003 | Barringer et al. | 174/35 R |
| 6,667,890 B1 * | 12/2003 | Barringer et al. | 361/752 |
| 6,671,184 B1 * | 12/2003 | Barringer et al. | 361/801 |
| 6,678,170 B2 * | 1/2004 | Barringer et al. | 361/800 |
| 6,709,276 B2 * | 3/2004 | Barringer et al. | 439/64 |

* cited by examiner

Primary Examiner—Tulsidas Patel
Assistant Examiner—Dameon E. Levi
(74) Attorney, Agent, or Firm—Floyd A. Gonzalez; Cantor Colburn LLP

(57) ABSTRACT

A pluggable cartridge for inserting a circuit card into an enclosure without operator access to the enclosure interior is provided. The cartridge includes a top portion and a first wall configured to secure the circuit card thereon for movement in unison therewith and a second wall. The first and second walls have a bottom edge and a top edge wherein the top edge of the first wall is movably secured to the top portion. The top edge of the second wall is removably secured to the top portion by snap-fit means. The circuit card is housed within and protected by the first and second walls so as to be moveable with respect to the bottom edge of the second wall. A tail stock bezel is removably secured by snap-fit means at one end of the second wall and top portion. A handle is movably connected to the top portion so as to be movable between a first position and a second position. A portion of the handle is operably attached to the first wall by an articulated mechanical linkage such that movement of the handle to the first position causes the printed circuit card secured to the first wall to move to a position proximate the bottom edge. Movement of the handle to the second position causes the printed circuit card to move to a position remote from the bottom edge.

23 Claims, 11 Drawing Sheets

CASSETTE HOUSING FOR PRINTED CIRCUIT CARDS

RELATED APPLICATION

This application is related to commonly owned and assigned U.S. patent application Ser. No. 09/941,912 filed on Aug. 29, 2001, entitled "Auto Docking/Locking Rack Hardware For Easy Serviceability of Printed Circuit Cards in Tight Spaces", the contents of which are incorporated herein in their entirety by reference thereto.

BACKGROUND OF THE INVENTION

The present disclosure is directed to assembly and installation of cassette housings for circuit cards disposed therewith. More particularly, the present disclosure is directed to snap-fit assembly of circuit card cassettes having the ability to assemble the cassettes without tools or trained personnel. Such cassettes find use in a variety of different applications. For example, such cassettes find particular use in the area of circuit boards.

The past twenty-five or so years have seen the development of ever smaller electrical circuit components at the chip level. However, to take fullest advantage of achievements in electrical circuit miniaturization, one must package the resultant printed circuit cards containing these chips in an efficient manner. Clearly, the packaging of printed circuit cards in tight spaces is a direct logical extension of increasing chip level circuit densities. It should also be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, serves the very desirable goal of being able to operate the circuits effectively at higher frequencies, thus increasing the speed of numerous different forms of electrical systems, including but not limited to data processing systems.

Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades.

With increased circuit density there has also been a concomitantly driven increase in the number of power, signal and control lines which require electrical connections to be made between printed circuit cards and printed circuit boards. This means that the electrical connectors that carry these various electrical circuits between the cards and the boards have been required to carry more and more separate individual connections. A significant consequence of the increase in the number of individual electrical connections, all of which require surety of contact, is the corresponding increase in the force needed to insert printed circuit connectors into mating printed circuit board sockets. This aspect provides special design considerations for self contained cartridges that carry printed circuit cards which are meant to be inserted into printed circuit boards via actuating mechanisms contained within the cartridge itself.

The increase in the number of connections also poses other problems in the design of desirably compact packaging systems, particularly those designed for easy cartridge insertion and removal. In particular, the increased number of connections results in the use of connectors with an increased number of pins and socket holes. Since these structures are present in larger and larger numbers, the pin-and-socket connections (or the like) are themselves packed together with smaller and smaller distances between them. This aspect of the packaging problem brings along with it the problem of connecting pin alignment for the purpose of physically connecting oppositely disposed mating pins and socket holes. Alignment failure can severely and permanently damage both the printed circuit card and the printed circuit board into which the card is to be inserted.

Also of note is the fact that one of the principle purposes of the present invention is to provide cartridges which are capable of this self contained insertion actuation function. Even more particularly, the present invention employs cartridges which are designed to have no physical contact with any external structure except the printed circuit board itself. This means that cartridges of the present invention do not require any form of actuation mechanism which relies upon external structures such as an enclosure, cabinet or frame or upon any form of adaptation provided in a surrounding cabinet, frame or enclosure.

As an additional constraint on packaging design, it should be appreciated that, with increased circuit density, there is also a concomitant increase in power density and heat dissipation. Accordingly, packaging designs should be fully compatible with those aspects of system design associated with cooling functions. Also, to whatever extent possible, packaging designs should be: economical to produce; function smoothly; require little or no maintenance; be producible from inexpensive, readily available materials; and be reliably operable over a large number of insertion and removal operation cycles.

Yet one other concern arises in electrical systems as circuit feature size shrinks, operating frequencies increase and packaging densities grow larger, namely, the generation of electromagnetic interference (EMI). Electronic circuit packaging designs should thus also be compatible with structures and configurations that are employed to prevent the leakage of electromagnetic interference. To whatever extent possible, packaging designs should also include structures which actually contribute positively to the containment of electromagnetic interference.

It is also noted that the present discussion refers to printed circuit boards and printed circuit cards. As contemplated herein, the printed circuit board is the larger component into which at least one printed circuit card is inserted for purposes of electrical connection. The present disclosure places no specific limits on either the size of a printed circuit board or the size of a printed circuit card. In the most general situation, a circuit board will be populated with a plurality of printed circuit cards. That is, the printed board will have a number of printed circuit cards inserted therein. Accordingly, as used herein, the terms "printed circuit board" and "printed circuit card" are considered to be relative terms.

Accordingly, the present inventors are presented with the following sometimes competing packaging problems: connector pin alignment, cartridge alignment, rigid connection to a printed circuit board, dense and close packaging, cooling, electromagnetic interference shielding, hot pluggability, the desire to provide an easy-to-load and easy-to-assemble cartridge for carrying printed circuit cards, and mechanisms requiring a mechanical advantage for insertion and removal of printed circuit cards.

SUMMARY

A pluggable cartridge for inserting a circuit card into an enclosure without operator access to the enclosure interior is provided. The cartridge includes a top portion and a first wall configured to secure the circuit card thereon for movement in unison therewith and a second wall. The first and second walls have a bottom edge and a top edge wherein the top edge of the first wall is movably secured to the top portion. The top edge of the second wall is removably secured to the top portion by snap-fit means. The circuit card is housed within and protected by the first and second walls so as to be moveable with respect to the bottom edge of the second wall. A tail stock bezel is removably secured by snap-fit means at one end of the second wall and top portion. A handle is movably connected to the top portion so as to be movable between a first position and a second position. A portion of the handle is operably attached to the first wall by an articulated mechanical linkage such that movement of the handle to the first position causes the printed circuit card secured to the first wall to move to a position proximate the bottom edge. Movement of the handle to the second position causes the printed circuit card to move to a position remote from the bottom edge.

A method of snap-fit assembly of a pluggable cartridge having a circuit card secured thereto without requiring the need for any tools is also provide. The method includes adjustably securing the circuit card to a first wall of a card holder assembly movably coupled to a top portion. The card holder assembly is configured to secure the circuit card thereon for movement in unison therewith. The method further includes engaging a second wall with said top portion for snap-fit engagement, the second wall having a bottom edge and a top edge and removably securing the top edge of the second wall to the top portion by snap-fit means. The circuit card is housed within and protected by the first and second walls assembly so as to be moveable with respect to the bottom edge of the second wall. A tail stock bezel is slid on from the bottom edge to the top edge at one end of the second wall and the top portion and removably secured by said snap fit means at one end of the second wall and top portion. A handle is movably connected to the top portion so as to be movable between a first position and a second position, a portion of the handle is operably attached to the card holder assembly by an articulated mechanical linkage such that movement of the handle to the first position causes the circuit card to move to a position proximate the bottom edge and such that movement of the handle to the second position causes the printed circuit card to move to a position remote from the bottom edge.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
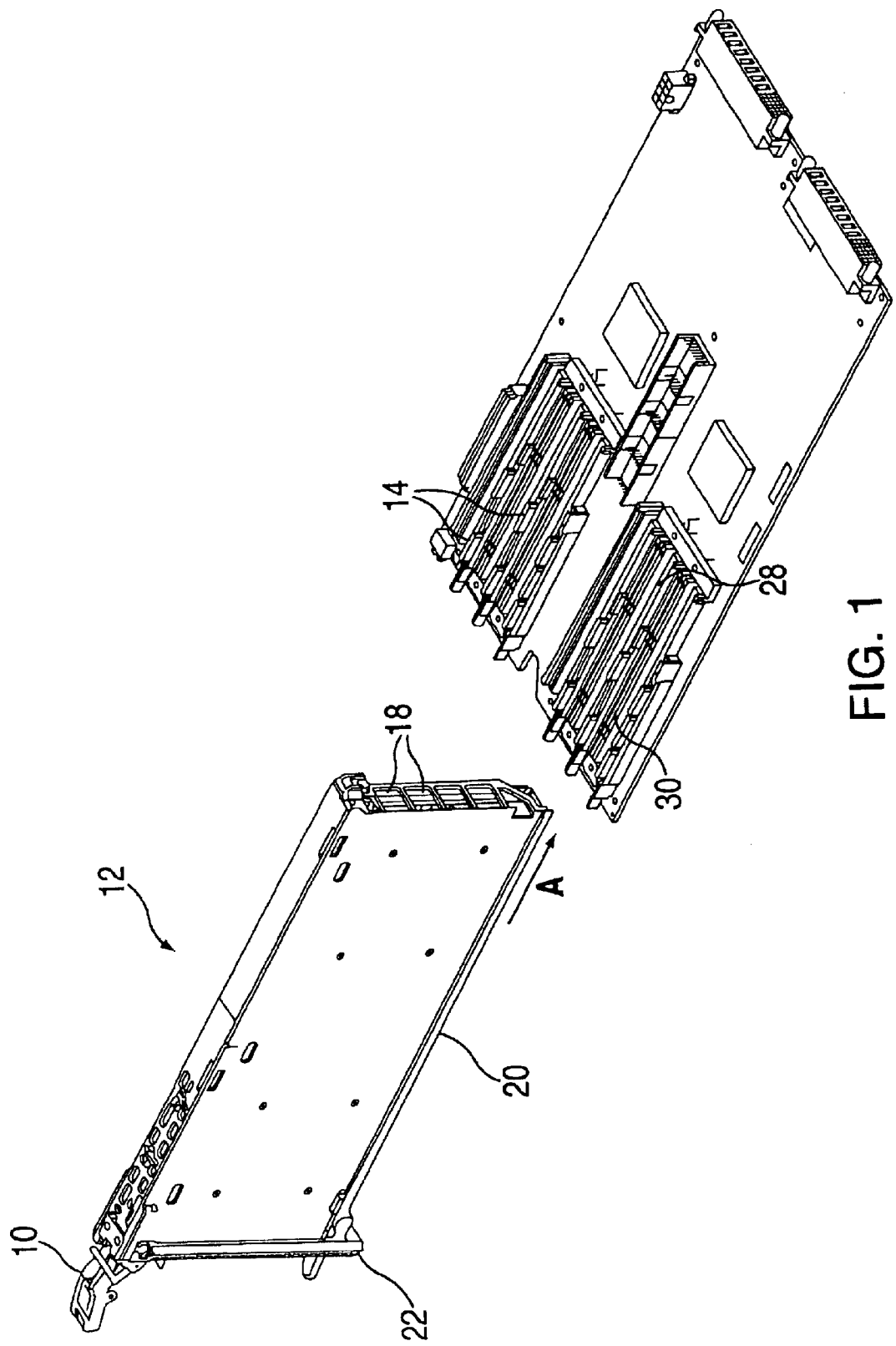
FIG. 1 is a front perspective view illustrating a component cartridge during installation.
Figure 2:
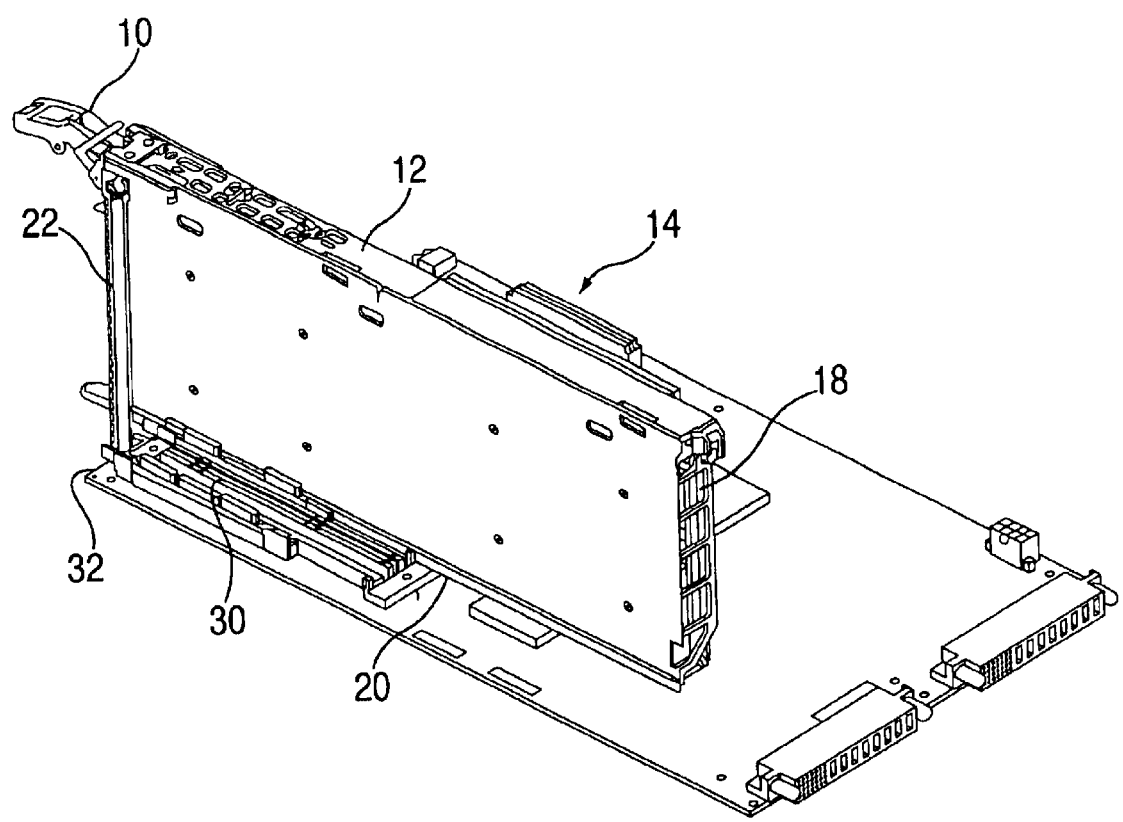
FIG. 2 is view of FIG. 1 illustrating the component cartridge after installation.

The present disclosure is directed to an exemplary embodiment of a snap-fit cassette assembly for bi-directional loading and unloading a printed circuit card with respect to a printed circuit board. The snap-fit cassette assembly is assembled without the need for trained personnel or tools. The snap-fit cassette assembly includes an actuating mechanism operably connected to the printed circuit card for engaging and disengaging the printed circuit card with the printed circuit board. The actuating mechanism includes a handle moveable between a first position and a second position operably moving the printed circuit card in a linear direction corresponding to the engagement and disengagement of the printed circuit card. The handle provides a securing feature in each of the positions. Namely, the handle can be locked into place when it is in the first position and can be latched into place when it is in the second position. The handle is prevented from being moved when it is either locked in the first position or latched in the second position. An integral release finger is configured to unlock and unlatch the handle with a simple pressing movement on the release finger. Thus, the handle can easily be moved between the first and second positions, the locked/unlocked state, and the latched/unlatched state with one hand.

Referring now to FIGS. 1–4, an exemplary embodiment of a handle 10 is illustrated with reference to a pluggable cartridge 12 and a guide structure 14. The cartridge 12 is shown before insertion into the structure 14 in FIG. 1 and is shown fully inserted into the structure in FIG. 2. In order to install the cartridge 12, the cartridge is slid into the guide structure 14 in the direction of arrow A. The handle 10 is then moved to secure/interconnect various components of the cartridge 12 to various components of the structure 14.

The cartridge 12 comprises a printed circuit card holder assembly 16 (see FIG. 3), a front wall 18, a bottom edge 20, and a back wall 22. A printed circuit card 15 (see FIG. 10) is grasped by edges thereof by card holder assembly 16 and housed within and protected by the walls of the cartridge 12. Additionally, the card 16 is mounted within the cartridge 12 so as to be moveable in the direction indicated by arrow B. For example, the card 15 can be mounted within the cartridge 12 to move up/down within the cartridge.

An articulated mechanical linkage 24 connects the handle 10 and the card holder assembly 16 to one another. The handle 10 is configured to move between a first or up position (see FIG. 3) and a second or down position (see FIG. 8). When the handle 10 is moved up to the first position, the card 16 is moved down to a position proximate the bottom edge 20. Conversely, when the handle 10 is moved down to the second position, the card 15 is moved up toga position that is remote from the bottom edge 20.

Figure 10:
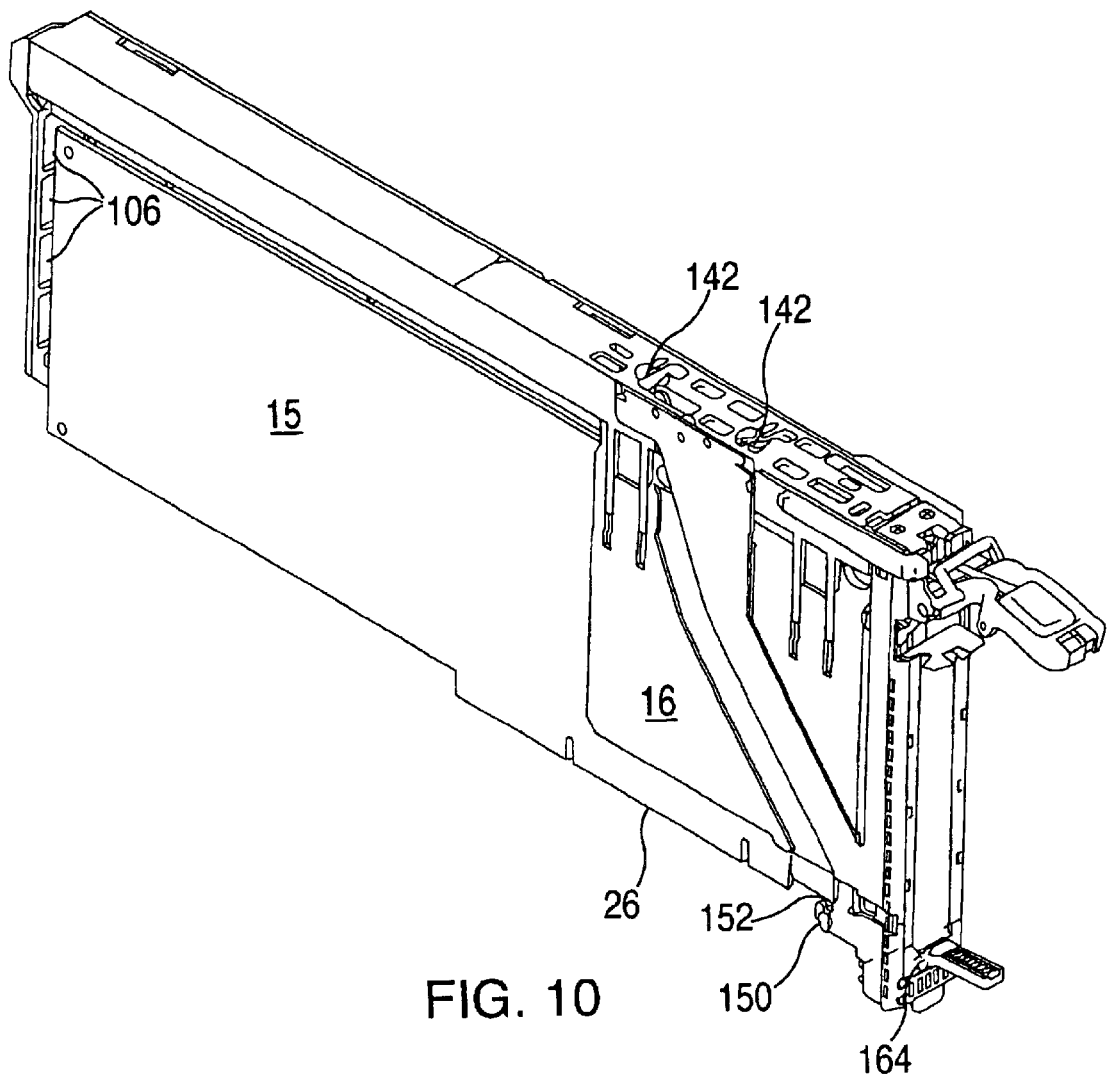
FIG. 10 is another rear perspective view of the partially assembled component cartridge in FIG. 9 illustrating an opposite side of the partially assembled component cartridge.
Figure 11:
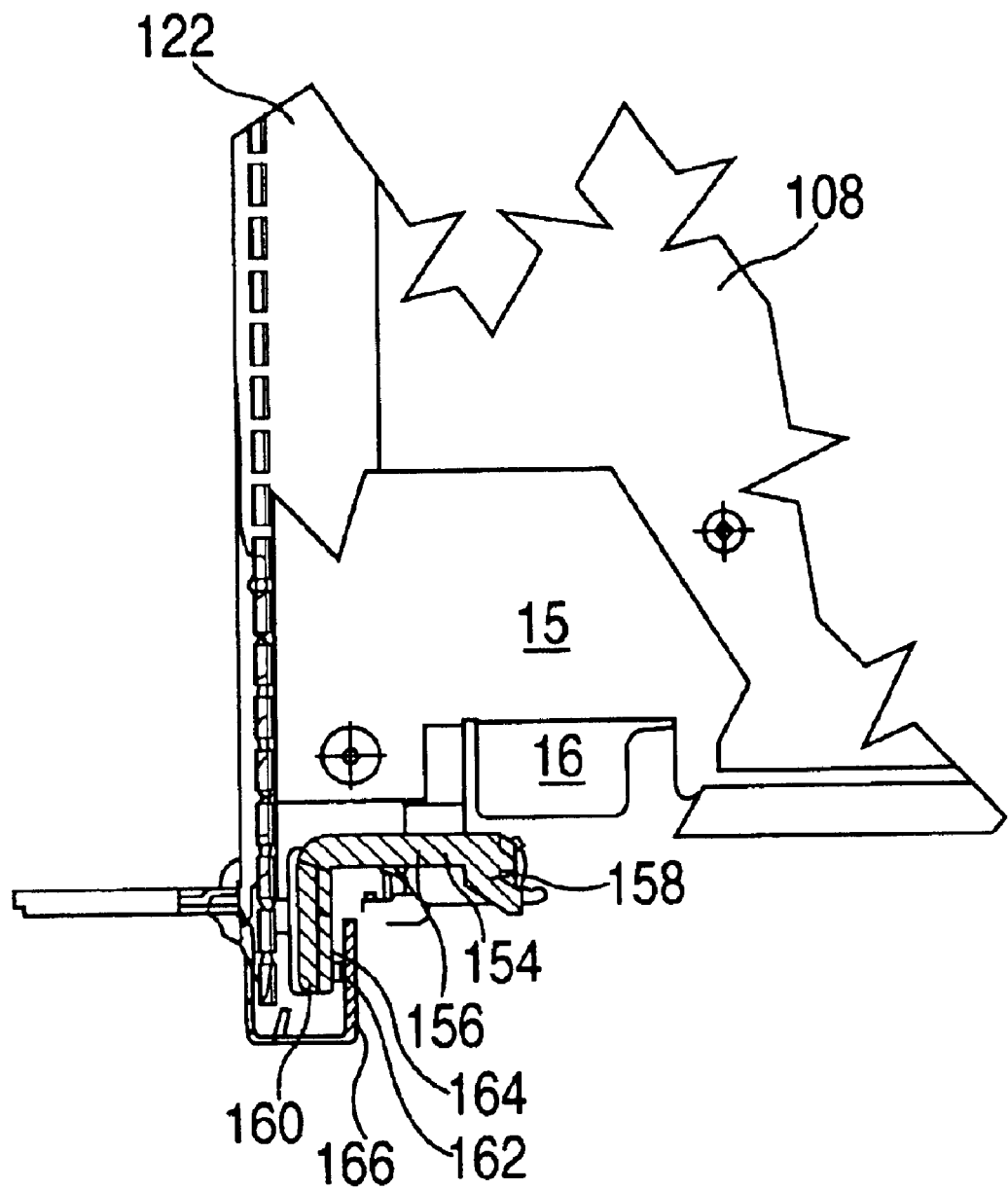
FIG. 11 is an enlarged partial cutaway side view of FIG. 8 detailing snap-fit assembly between the tail stock bezel and the partially assembled component cartridge.

The card 15 comprises a plurality of electrical connectors 26 along its edge proximate to the bottom edge 20 of the cartridge 12 (see FIG. 10). The connectors 26 are accessible (e.g., extend from the cartridge) when the card has been moved down to a position proximate the bottom edge 20. Conversely, the connectors 26 are inaccessible (e.g., retracted into the cartridge) when the card has been moved up to a position remote from the bottom edge 20. Accordingly, the movement of the handle 10 causes the card 15 to move within the cartridge 12 to extend and retract the connectors 26.

The guide structure 14 supports one or more printed circuit boards 28. Each printed circuit board 28 contains a plurality of electrical connectors 30. The connectors 30 of the printed circuit board 28 are configured to mate with the connectors 26 of the printed circuit card 16. In an exemplary embodiment, the connectors 30 are female connectors and the connectors 26 are male connectors. Of course, it is contemplated for the connectors 30 to be male connectors and the connectors 26 to be female connectors, or combinations thereof. In this manner, the connectors 26 and 30 are configured to place the card 16 and the board 28 in electrical communication with one another when the card is plugged or seated in the board.

During the installation of the cartridge 12, the handle 10 is in the down position such that the connectors 26 are retracted within the cartridge. The cartridge 12 is slid into position in the structure 14 until the back wall 22 of the cartridge abuts a stop portion 32 of the structure (see FIG. 2). At this point, the connectors 26 of the card 16 are in a faced spaced relationship with the connectors 30 of the board 28. The card 16 is plugged or seated into the board 28 by moving the handle 10 to the up position. This drives the card 16 downward within the cartridge 12 so that the connectors 26 and 30 mate with one another.

This process is reversed during the removal of the cartridge 12. Namely, the handle 10 is moved to the down position such that the connectors 26 retract into the cartridge. In this position, the connectors 26 are unseated from the connectors 30 of the board 28. The cartridge 12 is slid from the structure 14 until the front wall 18 of the cartridge is free from the structure.

The force necessary to seat and unseat the connectors 26 in the connectors 30 has also been increased by the increased number of electrical circuits disposed on the card 16 and board 28. It is not uncommon for the seating force to exceed about 30 pounds. In prior systems, it was necessary to have access to the top wall of the cartridge 12 in order to apply this seating force. Advantageously, the handle 10 is configured to provide a mechanical advantage or leverage to assist in seating and unseating the card 16 and the board 28 without having access to the top of the card.

In an exemplary embodiment, the handle 10 provides a mechanical advantage of about 3 to 1. In addition, the handle 10 in combination with the mechanical linkage 24 provides an overall mechanical advantage of about 4.8 to 1. Thus, only about 6.25 pounds of force need be applied to the handle 10 in order to seat and unseat the card 16 from the board 28. Of course, it is contemplated for the handle 10 and/or the mechanical linkage 24 to provide a higher or lower mechanical advantage. For example, the handle 10 can be made longer and/or the linkage's leverage can be increased or decreased as needed.

Of course, it should be recognized that the articulated mechanical linkage 24 illustrates an exemplary mechanism for imparting motion to printed circuit card 16. However, any convenient arrangement of pivoted levers may be employed provided that the movement of the handle 10 causes the card 16 to move in the desired directions.

The cartridge 12 can be snap-fit assembled in the structure 14 prior to shipping of this assembly. Advantageously, the handle 10 locks the printed circuit card 15 in the plugged position in the printed circuit board 28. Thus, the handle 10 can mitigate the unplugging of the printed circuit card 15 from the printed circuit board 28 that can occur due to shocks and vibrations that can occur during shipping (e.g., ship shock). Alternatively, as shown and described below with reference to FIGS. 6–10, cartridge 12 can be shipped unassembled and assembled in the field without the need for a trained service personnel or tools. Likewise, repair or replacement of a printed circuit card within the cartridge may be done in the field without the need for a trained service personnel or use of tools.

The cartridge 12 can be removed from the structure 14, such as can occur when servicing the assembly. Damage to the printed circuit card 16 and/or the printed circuit board 28 can occur if the cartridge is removed from the structure while the connectors 26 are seated in the connectors 30. Accordingly, it is typically desired for the connectors 26 to remain retracted, and thus unseated from the connectors 30 of the board 28. This ensures that the connectors 26 and 30 are not in electrical communication with one another or cannot make intermittent electrical communication with one another during removal of the cartridge 12 from the structure 14. Advantageously, the handle 10 is also configured to latch the printed circuit card 16 in the unplugged position. Thus, the handle 10 can mitigate the electrical contact between the connectors 26 and 30 during the removal of the cartridge 12 from the structure 14.

Figure 4:
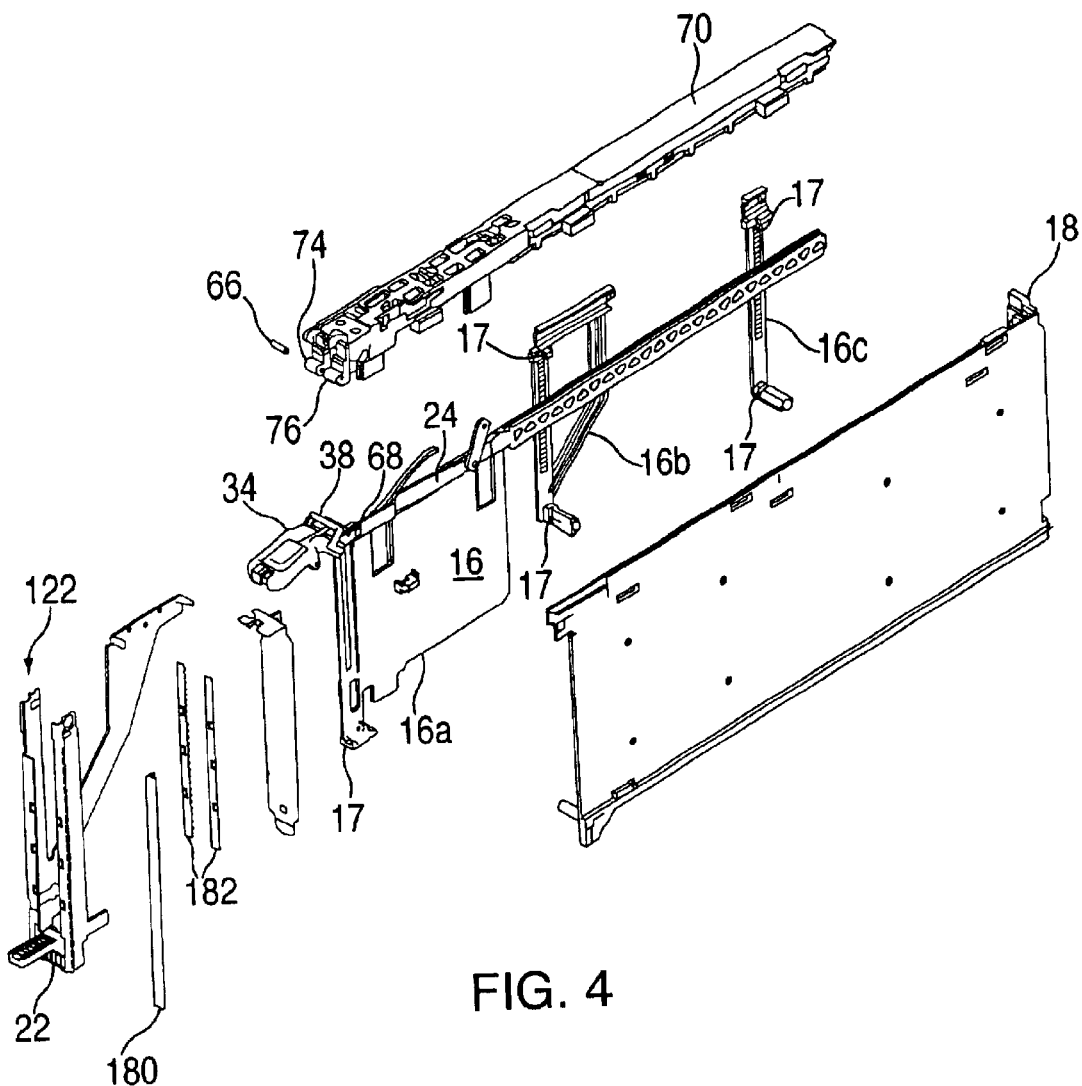
FIG. 4 is an exploded view of FIG. 3.
Figure 5:
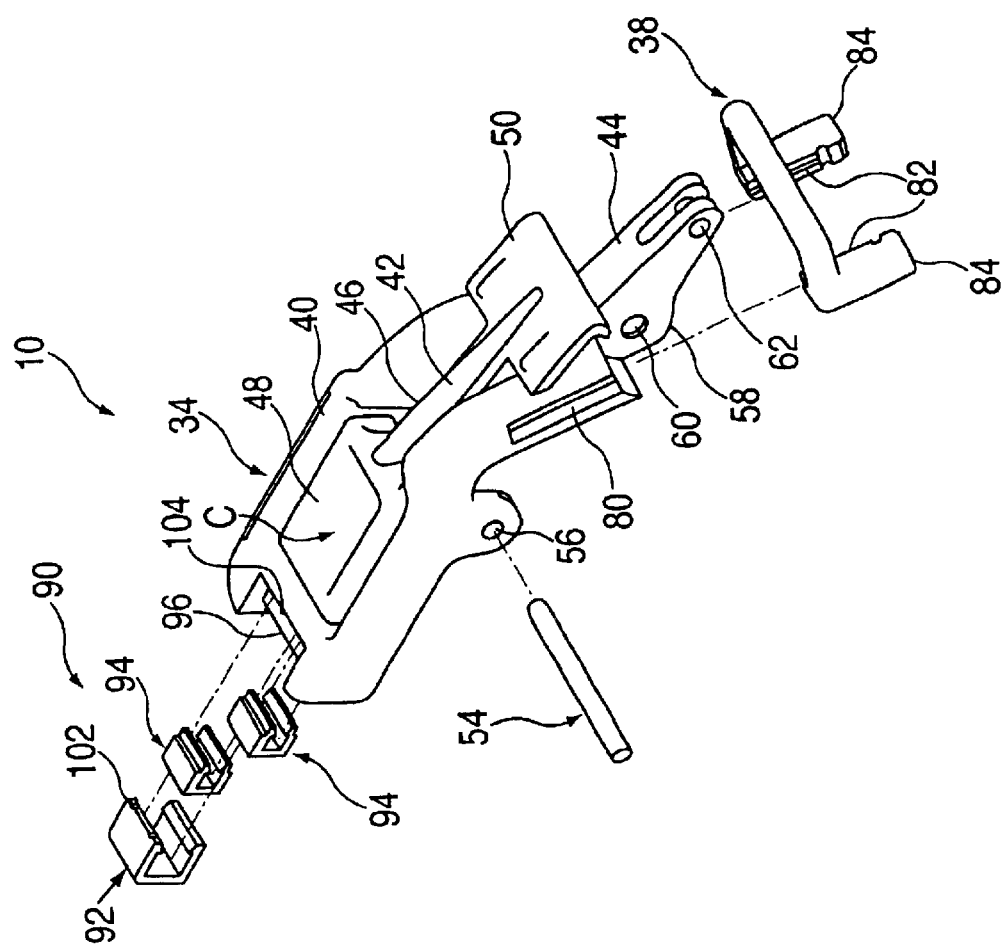
FIG. 5 is an exploded view of an exemplary embodiment of a locking and latching handle.

Referring now to FIGS. 4–5, the handle 10 comprises a handle body 34, a pivot block 36, and a latching arm 38. The operation of the handle 10 is therefore best understood with the simultaneous reference to these figures. The handle body 34 (FIG. 5) comprises a gripping member 40, a release finger 42, and a pivot leg 44. The handle body 34 has a substantially unitary construction and thus can be molded in a single molding operation.

The release finger 42 is disposed within the gripping member 40. More specifically, the release finger 42 depends from the gripping member 40 at a biasing portion 46. The release finger 42 comprises a first end 48 and a second end 50.

The materials of the handle body 34 impart sufficient rigidity to the handle body, but also impart a selected amount of flexibility to the biasing portion 46. Thus, the release finger 42 is configured to be depressed by imparting a release force on the first end 48 in the direction of arrow C. The release force causes the biasing portion 46 to elastically flex to allow the first end 48 to move in the direction of the force, which causes the second end 50 to move in a direction opposite the force. Namely, the biasing portion 46 acts as a fulcrum to allow the force on the first end 48 to control the position on the second end 50. Once the force is released, the elasticity of the biasing portion 46 returns the release finger 42 to its normal position.

In a first exemplary embodiment, the handle body 34 is formed of a polycarbonate material. For example, the handle body 34 can be formed of a polycarbonate material having a glass fiber reinforcing dispersed therein. In an exemplary embodiment, the handle body 34 is formed of polycarbonate having about 30% glass fiber reinforcing.

The handle body 34 can further comprise a support bar 54 (FIG. 5). The support bar 54 can be positioned below the first end 48 of the release finger 42 or above the second end 50 of the release finger. In this way, the support bar 54 can be used to provide a maximum range of motion of the first end 48. By limiting the range of motion of the first end 48, the support bar 54 can ensure that the biasing portion 46 is not stressed beyond its elastic limit. The support bar 54 is illustrated by way of example only as being inserted into match holes 56 formed in the gripping member 40. However, it is also contemplated for the support bar 54 to be integral with the handle body 34.

The pivot leg 44 extends from the gripping member 40 at a pivot point 58. The leg 44 comprises a first hole 60 and a second hole 62. The first hole 60 is configured for use in securing the handle body 34 to the pivot block 36. For example, the pivot block 36 (FIG. 4) comprises a connection point 64. A connecting member 66, such as a screw or a rod (FIG. 4), can be inserted through the first hole 60 and the connection point 64 to secure the pivot leg 44 and the pivot block to one another. The connection member 66 allows the pivot leg 44 to rotate within the pivot block 36.

The second hole 62 is configured for use in securing the handle body 34 to the mechanical linkage 24. For example, a connecting member 68, such as a screw or a rod (FIG. 4), can be inserted through the second hole 62 and the linkage 24 to secure the pivot leg 44 and the linkage to one another. The connecting member 68 allows the pivot leg 44 and the mechanical linkage 24 to rotate with respect to one another.

The handle body 34 rotates within the pivot block 36 such that the handle 10 moves between the first and second positions. As the handle body 34 rotates within the pivot block 36, the pivot point 58 acts as a fulcrum. Thus, the seating/unseating force that is applied to the handle 10 at the gripping member 40 can be applied with a selected mechanical advantage to the mechanical linkage 24. As discussed above, the handle 10 can have a mechanical advantage of about 3 to 1. Specifically, the pivot point 58 is positioned so as to provide the gripping member 40 with a mechanical advantage with respect to the location of the second hole 62 (e.g., the connection point to the mechanical linkage).

Figure 3:
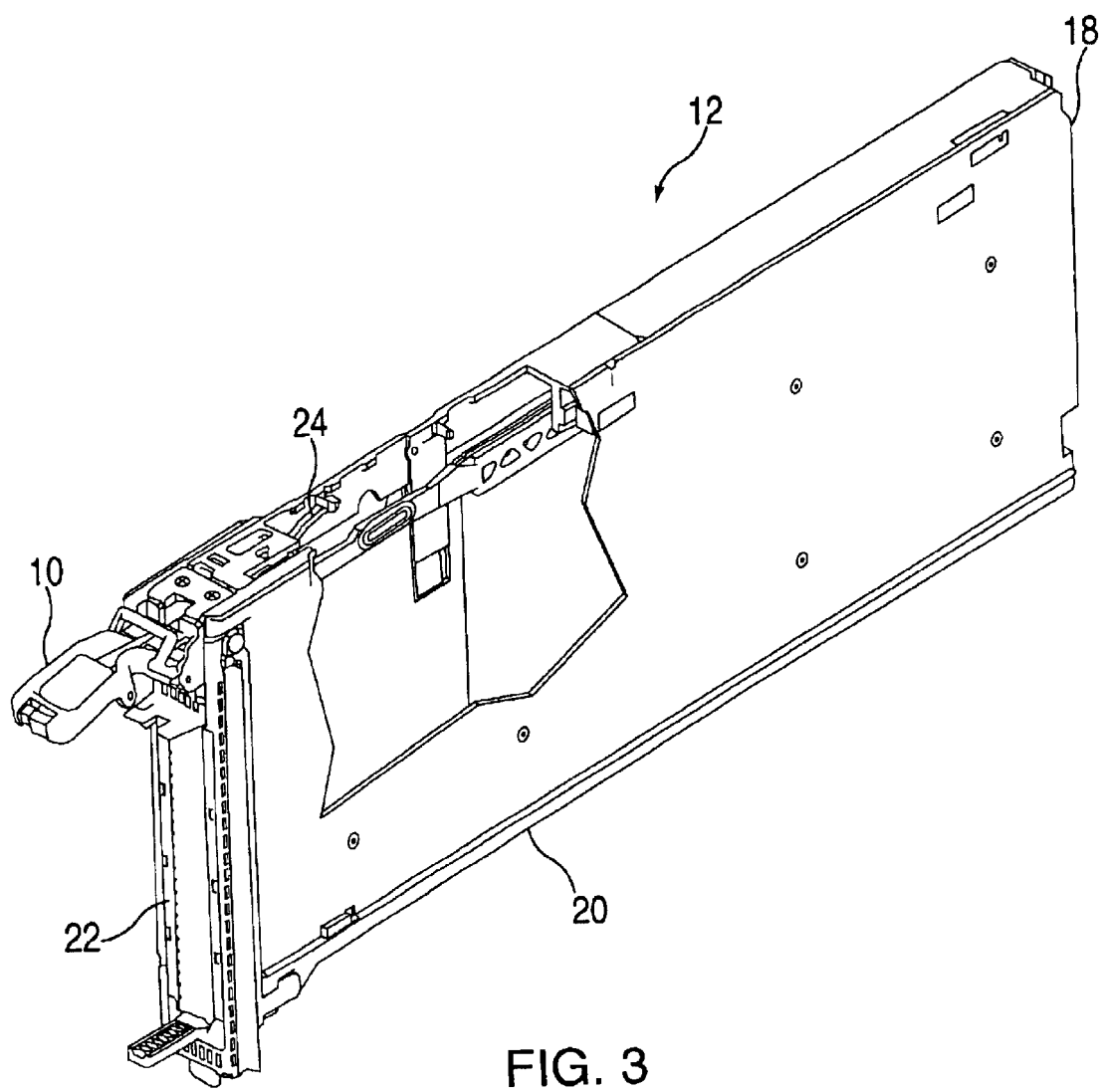
FIG. 3 is a rear perspective view of the component cartridge of FIG. 1.

In an exemplary embodiment depicted in FIG. 3, the pivot block 36 is integrally formed with a track 70 that is configured to cooperate with mechanical linkage 24 and holder assembly 16. The pivot block 36 comprises a locking feature 74 and a latching feature 76. The locking feature 74 coincides with the first position of the handle 10, while the latching feature 76 coincides with the second position of the handle.

The locking feature 74 is configured to lockably receive the second end 50 of the release finger 42. Namely, the second end 50 of the release finger 42 is lockably received in the locking feature 74 when the handle 10 has been rotated to the first position.

The front edge of the locking feature 74 has a slight chamfer (not shown) defined thereon. As the handle 10 is rotated to the first position, the second end 50 of the release finger 42 abuts the chamfer. The interaction of the chamfer on the second end 50 causes the biasing portion 46 to flex to allow the second end to ride up and over the chamfer. Once the handle 10 is in the first position, the biasing portion 46 elastically flexes to allow the second end 50 to lock in the locking feature 74.

In order to release the second end 50 from the locking feature 74, the release force is applied to the first end 48 of the release finger 42 in the direction of arrow C (FIG. 5). As discussed above, the release force causes the biasing portion 46 to elastically flex and causes the second end 50 to move in a direction opposite the force (e.g., upward in the orientation of the handle illustrated in the Figures). By moving the second end 50 upward, the second end is released from the locking feature 74, which allows the handle body 34 to be rotated from the first position.

In this manner, the release finger 42 IS configured to lock the handle 10 in place by simply rotating the handle to the first position, and is configured to be unlocked and moved away from the first position by merely depressing the first end 48 while rotating the handle body 34.

As discussed above, the handle 10 also comprises a latching arm 38. The latching feature 76 of the pivot block 36 is configured to latchably receive the latching arm 38.

The latching arm 38 is slideably secured to the handle body 34. Specifically, the handle body 34 comprises one or more channels 80 disposed thereon (FIG. 5). The latching arm 38 comprises an inner surface 82 (FIG. 5). The latching arm 38 is secured to the handle body 34 such that the inner surface 82 rides in the channel 80. The latching arm 38 can slide in the channel 80 between a latched position proximate the pivot block 38 and an unlatched position remote from the pivot block. When the latching arm 38 is in the latched position, the ends 84 of the latching arm 38 rest in the latching feature 76 of the pivot block 36.

Handle 10 is configured to be latched in the second position by rotating the handle body to the second position and sliding the latching arm 38 into the latching feature 76 of the pivot block 38. The handle 10 can be unlatched by merely depressing the first end 48 of the release finger 42.

Accordingly, the release finger 42 unsecures both locking and latching features by simply depressing the first end 48 of the release finger. The handle 10 is locked in the first position by simply moving the handle body 34 to the first position. The handle 10 is latched in the second position by simply moving the handle body 34 to the second position and sliding the latching arm 38 into the latching feature 76. Thus, the handle 10 can easily be moved between the first and second positions, the locked/unlocked states, and the latched/unlatched states with one hand.

By latching the handle 10 in the second position, the handle provides a gripping location for sliding the cartridge 12 into and out of the structure 14. Namely, the cartridge 12 can be slid into the structure 14 by pushing on the handle 10 until the front wall 18 of the cartridge abuts a stop portion 32 of the structure. Conversely, the cartridge 12 can be slid out of the structure 14 by pulling on the handle 10 until the front wall 18 of the cartridge is free from the structure.

Additionally, the handle 10 provides a positive visual indicator as to the position of the card 16 in the board 28. Namely, the handle 10 locks the card 16 in the seated position and latches the card in the unseated position. The position of the card 16 (e.g., seated or unseated) can be discerned merely by looking at the position of the handle 10.

The handle 10 also allows for the cooling of the electronic components, when in the first or locked position. Typically, the card 16 is cooled by directing a supply of cooling air through the cartridge 12. The cooling air can be directed across the card 16 by forcing air through the cartridge 12 from the front wall 18 to the back wall 22. Alternately, cooling air can be directed across the card 16 by forcing air through the cartridge 12 from the back wall 22 to the front wall 18. Advantageously, the handle 10 is configured to not block the flow of cooling air when the card 16 is operative. Namely, when the handle 10 is in its first position such that the card 16 is seated in the board 28 (e.g., the card is operative), the handle is locked up away from the back wall 22 of the cartridge. Thus, cooling air is allowed to flow through the cartridge 12 unrestricted by the handle 10 to cool the card 16.

The handle 10 also does not take up valuable space in the structure 14, when in the first or locked position. In an exemplary embodiment, the handle 10 extends off the rear wall 22 of the cartridge 12 by about one inch. The rear wall 22 of the cartridge 12 also typically includes data and/or communications cables (not shown) plugged therein. These cables then run from the rear wall 22 of the cartridge 12 to other components within the structure 14. It is common for the cables to have a minimum bend radius of about one inch or more. Thus, the distance the handle 10 extends from the rear wall 22 of the cartridge 12 is well within the minimum bend radius of the cables. Namely, the handle 10 fills the otherwise unusable space between the rear wall 22 of the cartridge 12 and the minimum bend radius of the cables.

Illustrated in FIG. 5, the handle 10 can also be configured to provide a visual indicator 90 of a status of the card 16. For example, some cards 16 may need to be powered down prior to removal from the printed circuit board 28. Alternately it may be desired for the manufacture to indicate that some of the cards 16 should be touched only by a trained factory technician, while other cards may be indicated as being touchable by the user. Thus, there is a desire for the handle 10 to have a visual indicator 90 to communicate a status the card 16.

The visual indicator 90 comprises a cover 92 and one or more tabs 94. In the illustrated embodiment, the visual indicator 90 comprises two tabs 94. The tabs 94 are arranged side by side on a portion of the handle body 34. For example, the handle body 34 can comprise an edge 96 configured to have the tabs 94 secured thereon. In the illustrated embodiment, the tabs 94 are configured to snap fit over a lip formed on the edge 96.

The cover 92 is slideably positioned over the tabs 94. For example, the cover 92 includes a tooth 98 that is configured to snap fit over a lip 100 formed on the rear edge of the tabs 94. The tooth 98 prevents the cover 92 from being removed from the tabs 92, but allows the cover to slide side to side over the tabs. The cover 92 is substantially the same width as the tabs 92. Thus, the cover 92 can be slid from a first position covering all or substantially all of one of the tabs 94, to a second position covering all or substantially all of other of the tabs.

The tabs 94 are different from one another so as to allow a user to discern them from each other. For example, the tabs 94 can have a different color, can have a different surface texture or pattern, can have different numerical or textual characters, and the like. By sliding the cover 92 from the first position to the second position, only one of the tabs 94 is visible at a time. Thus, the visual indicator 90 is provided by displaying only one of the tabs 94 at a time.

The cover 92 and tabs 94 can also comprise a means for maintaining the cover in a selected position. For example, the rear edge of the cover 92 can also comprise one or more indentations 102 defined therein. The edge 96 of the handle body 34 can comprise one or more protrusions 104 depending therefrom (FIG. 5). As the cover 92 is slid from covering one of the tabs 94 to covering the other of the tabs, the protrusion 104 causes the cover to flex. Once the protrusion 104 rests in the indentation 102, the resiliency of the cover 92 returns the cover to its normal position. Thus, the cooperation of the protrusion 104, indentation 102, and resiliency of the cover 92 serve to releaseably maintain the cover in the selected position.

Figure 6:
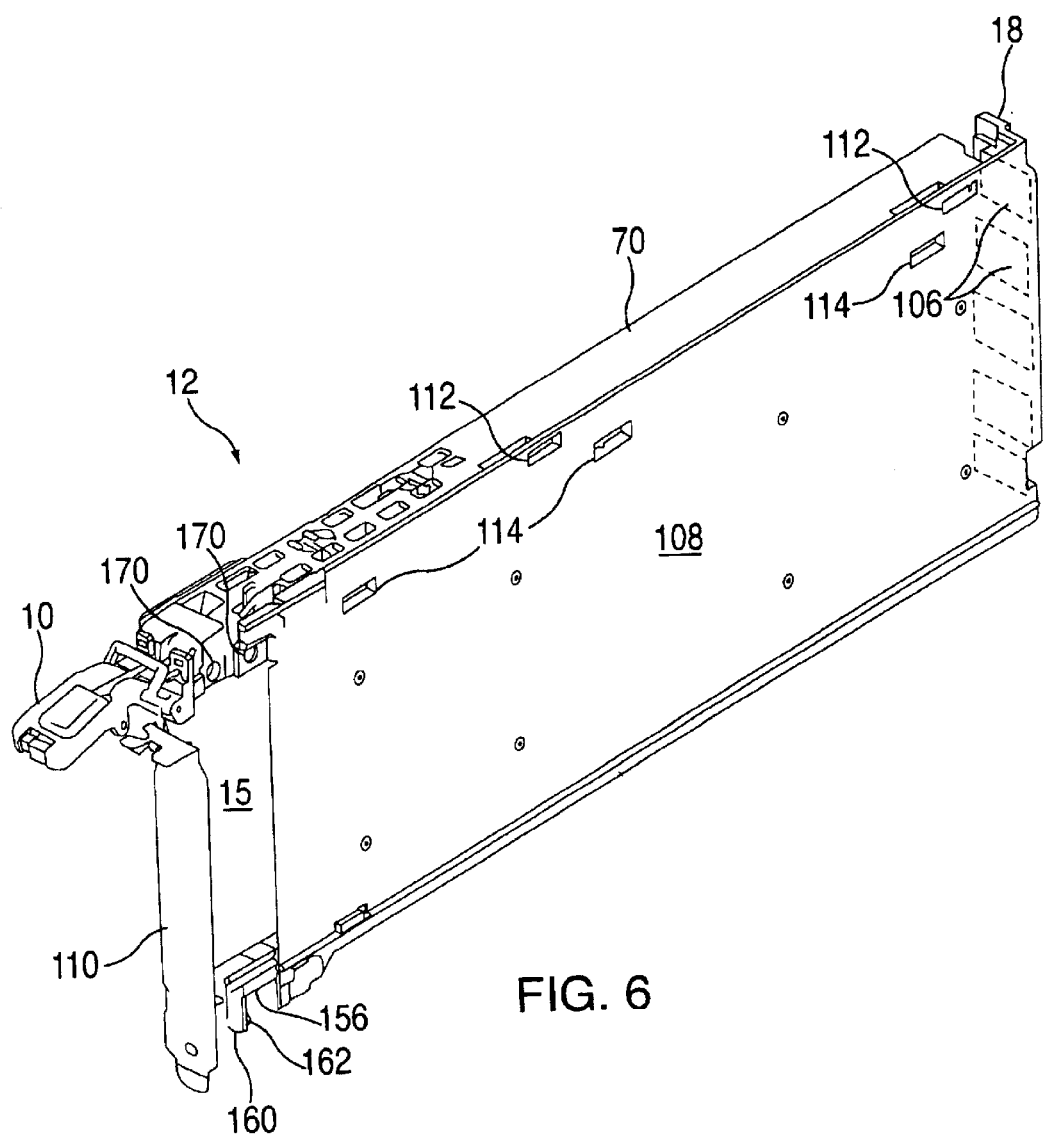
FIG. 6 is a rear perspective view of a partially assembled component cartridge.

In addition to illustrating the presence of apertures 106 (shown with phantom lines) in front wall 18 for the flow of cooling air, FIG. 6 shows an exemplary embodiment of a partially assembled snap-fit cartridge assembly. Apertures 106 cooperate with apertures 107 formed in a top surface of track 70 distal from apertures 106 formed in front wall 18 for advancement of airflow therethrough. FIG. 6 further illustrates a side view of a cover 108 depending substantially perpendicularly from front wall 18 and aligned with track 70 for snap-fit assembly. FIG. 6 also illustrates three the major components of cartridge 12: printed circuit card 15 having a widow bracket attached thereto, track 70 having handle 10 and mechanical linkage 24 attached thereto, and cover 108. FIG. 6 thus also shows the first stage in assembling cartridge 12. In particular, printed circuit card 15 is attached by its edges to card holder assembly 16 and attached to window bracket 110 using a mechanical fastener, such as a screw, for example. This connects card 15 to the actuating mechanism. In one embodiment, cover 108 preferably includes a first set 112 of three snap-fit hook retainers spaced along a length of cover 108 and a second set 114 of three snap-fit hook retainers spaced along a length of cover 108 below the first set 112 to provide releasable snap-fit retention with complementary snap-fit receptacles formed in track 70.

In an exemplary embodiment and referring again to FIG. 4 in conjunction with FIG. 6, printed circuit card holder assembly 16 preferably receives and removably retains edges of a PCI card 15. PCI card 15 is carried by the card holder 16 having three bifurcated arms or carriers 16a, 16b, and 16c. Each of the carriers 16a, 16b, and 16c presents slots 17 configured to grasp an edge portion of card 15. Carriers 16b and 16c are slidable along an extension arm 19 formed integrally with and extending from carrier 16a for adjustably grasping other sized cards 15. Carriers 16b and 16c further includes projections 21 to support the bottom edge 20 of cover 108 when assembled. At the rear of card holder 16 a stop (not shown) is slidably mounted on carrier 16a which functions as a stop for the alignment of a full length PCI card supported on the card holder. Such carriers or arms are shown and fully described in U.S. Pat. No. 6,062,894 assigned to the assignee of the present application and is incorporated by reference.

Figure 7:
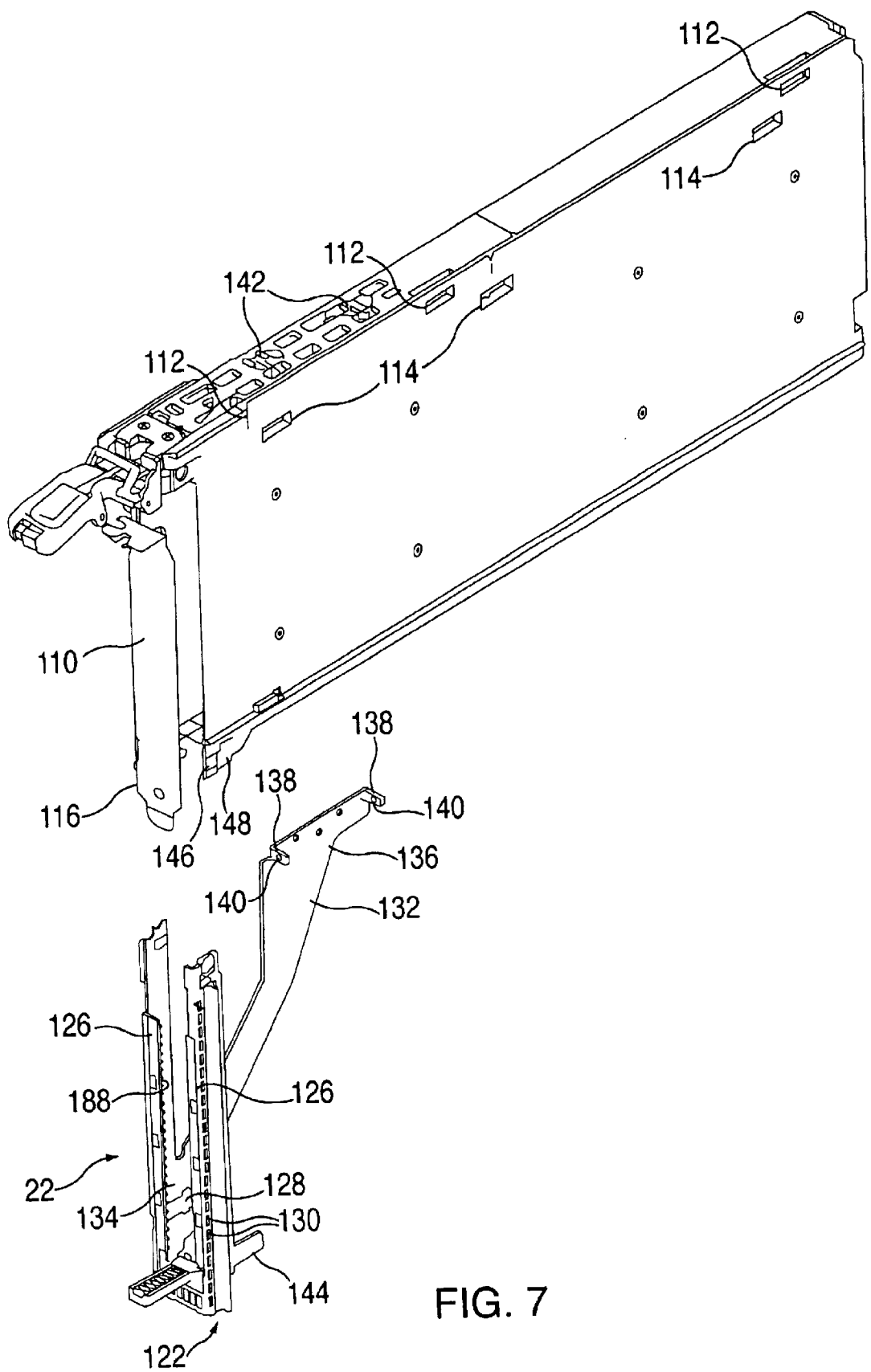
FIG. 7 is a rear perspective view of the partially assembled component cartridge in FIG. 6 before attachment of a tail stock bezel.
Figure 8:
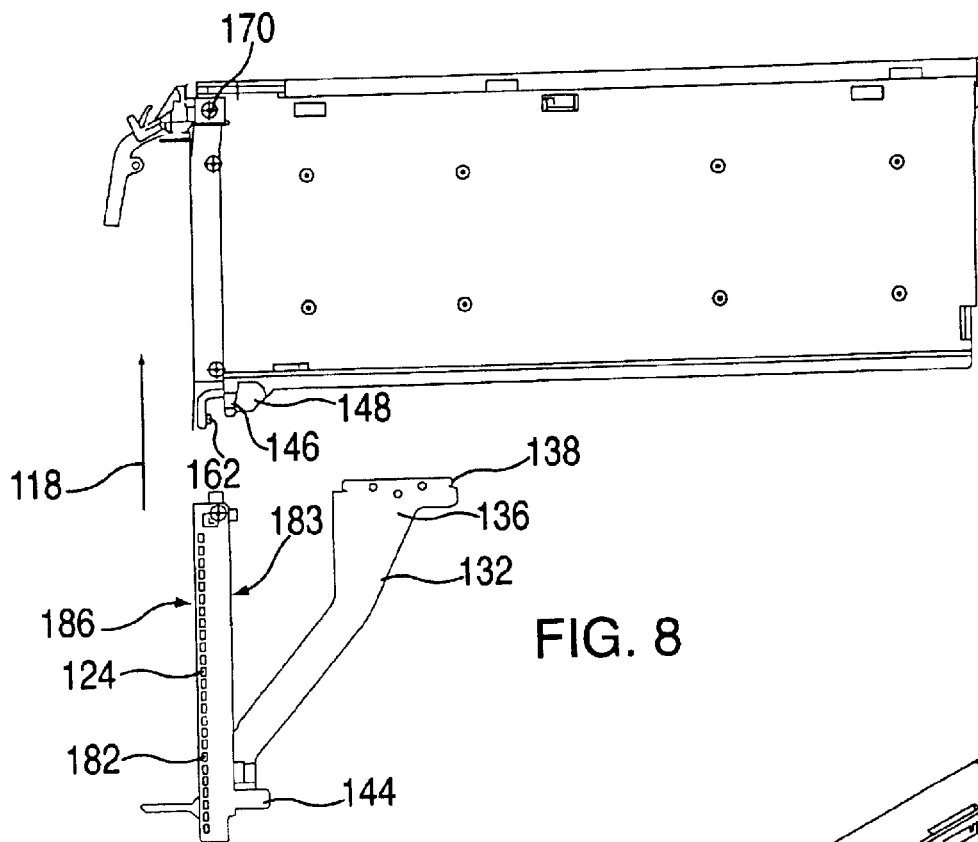
FIG. 8 is a side view of the partially assembled component cartridge in FIG. 7.

Referring to FIGS. 7 and 8, snap-fit assembly of cartridge 12 is furthered by engaging back wall 22 which is preferably attached by sliding back wall 22 over edges 116 defining window bracket 110 in a direction indicated by arrow 118. Back wall 22 is preferably configured as a tail stock bezel 122 having an EMC gasket 124 (FIG. 8) line each flange 126 defining a window 128 of bezel 122. Bezel 122 further includes vent holes 130 along a length on each side of bezel 122 cooperating with EMC gasket 124 to allow airflow therethrough. Bezel 122 further includes a support arm 132 extending from a bottom portion 134 of bezel 122 at an angle and terminating to form a support base 136 having two flanges 138 extending form base 136 defining substantially a length of base 136. Flanges 138 include detents 140 at an end of each flange 138. Each flange is configured to be received and removably retained in track 70 configured having a complementary arm 142 to retain each flange 138 via each detent 140. Bezel 122 preferably comprises an electrically conductive stamped metal material. Such a stamped metal material structure provides a rigid supportive structure while providing EMC shielding.

Once bezel 122 is slid in the direction indicated by arrow 118 over bracket 110 and cover 108, flanges 138 are in alignment to engage arms 142 by pushing base 136 towards track 70. In addition, bezel 122 is further affixed to the tail of cartridge 12 by interaction of a snap-fit assembly at the bottom portion 134 of bezel 122 and bottom edge 20 of cover 108. More specifically, bottom portion 134 of bezel 122 includes a tab 144 extending from an opposite side of arm 132. Tab 144 is configured to engage a first releasable snap-fit receptacle 146 configured on cover 108. Snap-fit receptacle 146 includes a complementary configured cavity 148 to substantially employ flush fit assembly between tab 144 and cover 108. A second releasable snap-fit receptacle 150 extends from an opposite side of cover 108 forming cavity 148 to engage a slot 152 formed in said support arm 132 proximate bottom portion 134 (see FIG. 10).

Referring to 6, 8, 10 and 11, a third releasable snap-fit receptacle 154 extends between first and second snap-fit receptacles 146, 150 that is substantially L-shaped. A first leg 156 of L-shaped receptacle 154 depends substantially perpendicular from a connector arm 158 connecting first and second receptacles 146, 150. A second leg 160 depending from first leg 156 includes a snap-fit protrusion 162 configured for releaseable snap-fit assembly with an aperture 164 configured in a wall 166 of bezel 122 substantially parallel with back wall 22 of bezel 122.

Figure 9:
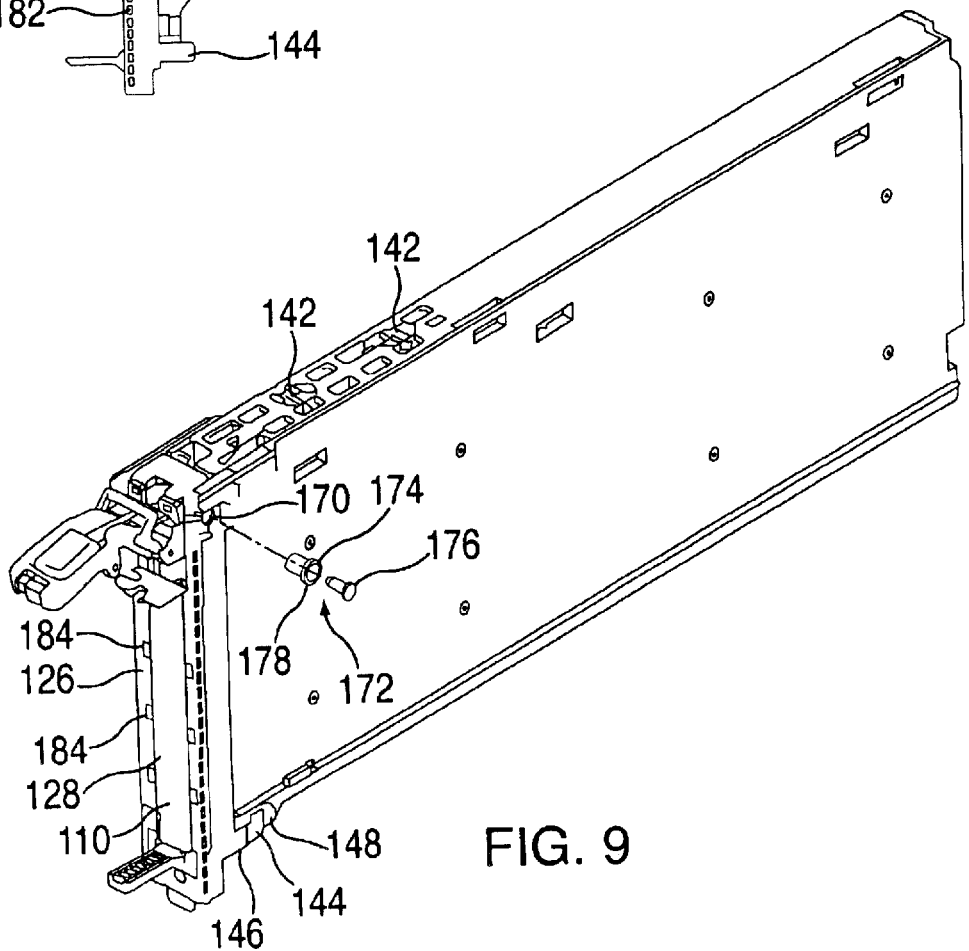
FIG. 9 is a rear perspective view of the partially assembled component cartridge in FIGS. 7 and 8 with attachment of the tail stock bezel.

Referring to FIG. 9, an aperture 170 is preferably configured in a top portion on one side of bezel 122 aligned with complementary apertures configured in cover 108 and track 70 for receipt of a releasable fastening device to further maintain snap-fit assembly of the corresponding parts. In an exemplary embodiment, the fastening device includes a plastic rivet assembly 172. Rivet assembly 172 includes a slotted push pin receptacle 174 configured for snugged engagement within apertures 170 and a push pin 176 receivable in a hole 178 in receptacle 174 to further snug engagement g receptacle 174 in apertures 170. For flexibility of circuit card removal and installation, rivet assembly 172 employed in conjunction with the cartridge of the present disclosure should be easily removable.

Referring again to FIG. 4, the side of tail stock bezel 122 which is opposite to the side shown in FIG. 10 also preferably includes an EMC shield 180 so that firm electrical contact for EMI shielding purposes is maintained between adjacently inserted cartridges. Additionally of note in FIG. 4 is the presence and location of two EMC shield springs 182 which provides firm electrical connection between bezel 122 and slidable window bracket 110.

Figure 12:
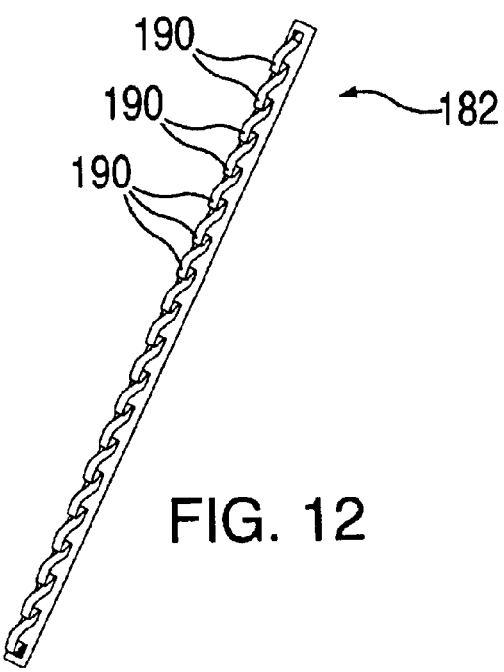
FIG. 12 is a rear perspective view of an EMC gasket employed with the tail stock.
Figure 13:
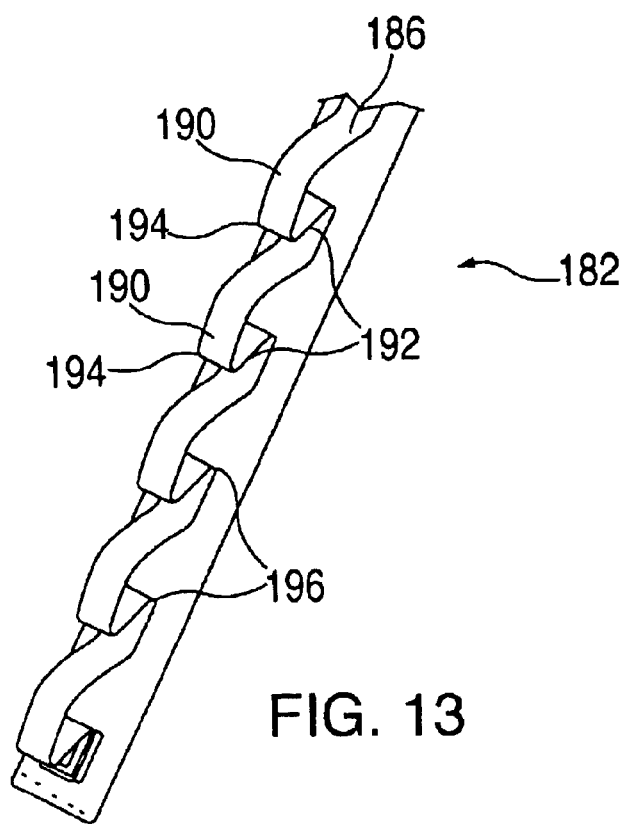
FIG. 13 is an enlarged rear perspective view of the EMC gasket shown in FIG. 12.

FIGS. 12 and 13 are also useful for illustrating part of an EMI shielding system employable in conjunction with preferred embodiments of the present disclosure. In particular, FIGS. 8 and 9 show the inclusion of EMC shield springs 182 mounted within a cavity 183, draped over edges defining window 128 and against both surfaces defining two sides of flanges 126 on bezel 122. Each EMC shield spring 182 is configured to be readily mounted on flange 126. In particular, each flange 126 includes a plurality of apertures 184 which engage a corresponding spring clip (not shown) aligned with a corresponding aperture 184. The spring clips are preferably configured on one surface 186 of spring 182 disposed along a length defining each shield spring 182. Accordingly, each shield spring includes a surface 188 which is in firm sliding electrical contact with window bracket 110 while the other surface 186 is on the other side of bezel 122 preferably draped or folded over an edge defining window 128 of bezel 122. The other side of shield spring 182 includes flexible portion 186 which extends a length of spring 182 and slidably and compressibly engages window bracket 110.

FIGS. 12 and 13 provide a detailed description of the structure of EMC shield spring 182. This shield spring preferably comprises a single sheet of stamped metal which is formed as shown. Preferable materials for this shield spring include beryllium copper (½ hard) with an alternate material being stainless steel (½ hard). FIG. 12 provides a perceptive view of the desired structure within cavity 183 of bezel 122, and FIG. 13 provides an enlarged partial view. In particular, it is noted that stamped shield spring 182 preferably includes prongs 190 which are formed by the stamping operation employed in the manufacture of the shield spring. Prong 190 is also employed to provide improved electrical contact between shield 182, window bracket 110 and bezel 122. It is further noted that FIG. 13 is particularly useful in that it identifies a plurality of surfaces or edges that are also visible in FIG. 12.

More particularly, prongs 190 provide sliding electrical contact with window bracket 110 when handle 10 is operated to move printed circuit card 15 into and out of contact with connectors employed with a receiving printed circuit board. Prongs 190 are preferably compressible to maintain sliding electrical contact with window bracket 1 10. In an exemplary embodiment, prongs 190 are wavelike for ease of manufacture while providing slidable and compressible electrical contact between window bracket 110 connected to printed circuit card 15 and outer bezel 122. Outer bezel 122 is preferably electrically grounded via contact with guide structure 14. It will be appreciated by one skill in the art that although prongs 190 are shown having a substantially straight section portion 192 extending from a peak 194 to a base surface 196 of shield spring 182 in FIG. 13 an alternative embodiment may be had with straight section portion 192 absent therefrom. In this manner, each prong is a stamped rectangular shape that is bent to form a peak 194 for sliding compressible electrical contact.

It should also be noted that the terms "first", "second", and "third", and the like may be used herein to modify elements performing similar and/or analogous functions. These modifiers do not imply a spatial, sequential, or hierarchical order to the modified elements unless specifically stated.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments failing within the scope of the appended claims.

What is claimed is:

1. A pluggable cartridge for inserting a circuit card into an enclosure without operator access to the enclosure interior, the cartridge comprising:

a top portion;

a first wall configured to secure the circuit card thereon for movement in unison therewith;

a second wall, said first and second walls having a bottom edge and a top edge, said top edge of said first wall movably secured to said top portion, said top edge of said second wall removably secured to said top portion by snap-fit means, the circuit card being housed within and protected by said first and second walls so as to be moveable with respect to said bottom edge of said second wall;

a tail stock bezel removably secured by said snap-fit means at one end of said second wall and said top portion;

a handle movably connected to said top portion so as to be movable between a first position and a second position, a portion of said handle being operably attached to said first wall by an articulated mechanical linkage such that movement of said handle to said first position causes said printed circuit card secured to said first wall to move to a position proximate said bottom edge and such that movement of said handle to said second position causes said printed circuit card to move to a position remote from said bottom edge.

2. The cartridge as in claim 1, further comprising:
a front wall depending substantially perpendicular from said second wall and opposite said tail stock bezel, said front wall configured with vents to allow air flow therethrough.

3. The cartridge as in claim 2, wherein said top portion is configured to align and to allow snap fit assembly with said top edge of said second wall.

4. The cartridge as in claim 3, wherein said tail stock bezel is configured to be slidably received at said bottom edge at said one end of said second wall and removably secured with said second wall at said bottom edge and said top edge by said snap-fit means.

5. The cartridge as in claim 4, wherein said tail stock bezel is configured having a brace extending from a bottom portion of said tail stock bezel on a side opposite said second wall to an intermediate portion of said top portion, said brace having at least one flange extending therefrom removably secured to said top portion.

6. The cartridge as in claim 5, wherein said tail stock bezel, said second wall and said top portion are removably secured with each other using a removable pin fastener extending through an aperture configured in each of said tail stock bezel, said second wall and said top portion when said aperture of each said tail stock bezel, said second wall and said top portion are aligned with each other.

7. The cartridge as in claim 1, wherein said printed circuit card is attached to a window bracket at said one end, said window bracket slidably translates within said tail stock bezel.

8. The cartridge as in claim 7, wherein said tail stock bezel includes an EMC gasket configured to attach to each flange defining a window of said bezel, said EMC gasket configured to provide electrical contact between said slidable window bracket and said bezel while allowing airflow through a plurality of vents extending a length of said tail stock bezel on both sides thereof.

9. The cartridge as in claim 1, further comprising:
a latching arm slideably secured to said handle, said first position defining a locked position having a portion of said handle lockably engaged with a pivot block formed at said one end of said top portion, and said second position defining a latched position having a portion of said latching arm slid toward said pivot block so as to be latchably engaged with said pivot block.

10. The cartridge as in claim 1, further comprising:
a plurality of electrical connectors disposed along an edge of said printed circuit card, said edge being proximate said bottom edge, said plurality of electrical connectors being extended from said bottom edge when said handle is in said first position and being retracted into said bottom edge when said handle is in said second position.

11. The cartridge as in claim 10, wherein said plurality of electrical connectors are selected from the group consisting of male connectors, female connectors, and a combination of male and female connectors.

12. The cartridge as in claim 1 wherein assembly of said circuit card to said first wall movably attached with top portion, assembly of said second wall with said top portion, and assembly of said tail stock bezel with said top portion and said second wall is done with snap-fit engagement without requiring additional fixing elements or tools.

13. The cartridge as in claim 12 wherein said snap-fit engagement is configured to be disassembled and reassembled multiple times.

14. The cartridge as in claim 1 wherein said circuit card is a PCI type card.

15. A method of snap-fit assembly of a pluggable cartridge having a circuit card secured thereto without requiring the need for any tools, the method, comprising:
adjustably securing the circuit card to a first wall of a card holder assembly movably coupled to a top portion, said card holder assembly configured to secure the circuit card thereon for movement in unison therewith;

engaging a second wall with said top portion by snap-fit engagement, said second wall having a bottom edge and a top edge;

removably securing said top edge of said second wall to said top portion by snap-fit means, the circuit card being housed within and protected by said first and second walls so as to be moveable with respect to said bottom edge of said second wall;

sliding a tail stock bezel from said bottom edge to said top edge at one end of said second wall and said top portion; and removably securing said tail stock bezel by said snap fit means at one end of said second wall and said top portion, wherein a handle is movably connected to said pivot block so as to be movable between a first position and a second position, a portion of said handle being operably attached to said card holder assembly by an articulated mechanical linkage such that movement of said handle to said first position causes said circuit card secured to said card holder assembly to move to a position proximate said bottom edge and such that movement of said handle to said second position causes said printed circuit card to move to a position remote from said bottom edge.

16. The method of snap-fit assembly as in claim 15 wherein, wherein said tail stock bezel is configured having a brace extending from a bottom portion of said tail stock bezel on a side opposite said second wall to an intermediate portion of said top portion, said brace having at least one flange extending therefrom removably secured to said top portion.

17. The method as in claim 6, wherein said tail stock bezel, said second wall and said top portion are removably secured with each other using a removable pin fastener extending through an aperture configured in each of said tail stock bezel, said second wall and said top portion when said aperture of each said tail stock bezel, said second wall and said top portion are aligned with each other.

18. The method as in claim 15, wherein said printed circuit card is attached to a window bracket at said one end, said window bracket slidably translates within said tail stock bezel.

19. The method as in claim 18 wherein said tail stock bezel includes an EMC gasket configured to attach to each flange defining a window of said bezel, said EMC gasket configured to provide electrical contact between said slidable window bracket and said bezel while allowing airflow through a plurality of vents extending a length of said tail stock bezel on both sides thereof.

20. An EMC gasket for EMC sealing between a slidable window bracket and an exterior tail stock bezel of a pluggable card assembly while allowing airflow through a plurality of veins extending a length of the tail stock bezel on both sides thereof, the EMC gasket comprising:

a thin metal strip configured to attach to opposite sides of a flange defining one side of a window of the exterior tail stock bezel, said thin metal strip defined by a first side and a second side folded around said flange;

a plurality of clips extending from said first side of said metal strip, said clips configured to removably secure the gasket to said flange; and a plurality of compressible contacts extending toward the slidable window bracket on said second side of said metal strip to make electrical contact with the window slidable bracket to form the EMC seal while allowing airflow in and out of the pluggable card assembly.

21. The EMC gasket according to claim 20, wherein at least one of said plurality of contacts is configured as a cutout portion from said metal strip forming a compressible structure and defining a corresponding aperture in said metal strip, each cutout portion extending from said second surface configured to make electrical contact with the window bracket.

22. The EMC gasket according to claim 21, wherein said each cutout portion includes at least one bend along a length thereof to facilitate at least one of compression of said compressible structure and slidable contact with the window bracket.

23. The EMC gasket according to claim 20, wherein said plurality of compressible contacts extending toward the window bracket define peaks of a wave structure extending a length of and depending from said second side of said metal strip.

* * * * *